(12) United States Patent
Benwadih et al.

(10) Patent No.: US 10,381,220 B2
(45) Date of Patent: Aug. 13, 2019

(54) REDUCTION IN THE ANNEALING TEMPERATURE OF AN IGZO LAYER OBTAINED BY SOL GEL

(71) Applicant: COMMISSARIAT A L'ENERGIE ATOMIQUE ET AUX ENERGIES ALTERNATIVES, Paris (FR)

(72) Inventors: Mohammed Benwadih, Champigny sur Marne (FR); Christine Revenant-Brizard, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 15/905,359

(22) Filed: Feb. 26, 2018

(65) Prior Publication Data

US 2018/0254185 A1    Sep. 6, 2018

(30) Foreign Application Priority Data

Mar. 1, 2017  (FR) ...................... 17 15675

(51) Int. Cl.
*H01L 21/02* (2006.01)
*H01L 29/786* (2006.01)
*H01L 29/24* (2006.01)

(52) U.S. Cl.
CPC .. *H01L 21/02628* (2013.01); *H01L 21/02422* (2013.01); *H01L 21/02472* (2013.01); *H01L 21/02483* (2013.01); *H01L 21/02502* (2013.01); *H01L 21/02554* (2013.01); *H01L 21/02565* (2013.01); *H01L 21/02592* (2013.01); *H01L 21/02664* (2013.01); *H01L 29/247* (2013.01); *H01L 29/78693* (2013.01)

(58) Field of Classification Search
CPC ......... H01L 21/02554; H01L 21/02502; H01L 21/02472; H01L 21/02483; H01L 21/02565
See application file for complete search history.

(56) References Cited

U.S. PATENT DOCUMENTS

| | | |
|---|---|---|
| 2010/0193782 A1 | 8/2010 | Sakata |
| 2015/0087110 A1 | 3/2015 | Facchetti et al. |
| 2015/0221507 A1 | 8/2015 | Won et al. |

FOREIGN PATENT DOCUMENTS

| | | | | |
|---|---|---|---|---|
| CN | 106128941 | * | 11/2016 | ....... H01L 21/02282 |
| EP | 2 149 911 A2 | | 2/2010 | |

OTHER PUBLICATIONS

French Preliminary Search Report dated Oct. 10, 2017 in French Application 17 51675, filed on Mar. 1, 2017 (with English Translation of Categories of cited documents).

(Continued)

*Primary Examiner* — Sonya D. McCall-Shepard
(74) *Attorney, Agent, or Firm* — Oblon, McClelland, Mauer & Neustadt, L.L.P.

(57) ABSTRACT

The present application relates to a method for forming an active zone of metal oxide for an electronic component including the formation of a stack of IXZO layers produced by liquid phase deposition on a substrate, the layers of said stack having different atomic fractions to each other in order to make it possible to reduce the annealing temperature enabling them to be made functional.

11 Claims, 3 Drawing Sheets

(56) References Cited

OTHER PUBLICATIONS

Robert A. Street, et al. "Sol-Gel Solution-Deposited InGaZnO Thin Film Transistors", Applied Materials & Interfaces, vol. 6, No. 6, 2014, 10 pages.
Christine Revenant, et al. "Morphology of sol-gel porous In—Ga—Zn—O thin films as a function of annealing temperatures", Thin Solid Films, vol. 616, 2016, 6 pages.
Yong-Hoon Kim, et al. "Effect of Metallic Composition on Electrical Properties of Solution-Processed Indium-Gallium-Zinc-Oxide Thin-Film Transistors", IEEE Transactions on Electron Devices, vol. 57, No. 5, 2010, 6 pages.
Mohammed Benwadih, et al. "Non-Arrhenius conduction due to the interface-trap-induced disorder in X-doped amorphous In—X—Zn oxides thin-film transistors", Journal of Applied Physic, vol. 117, No. 5, 2015, 5 pages.
Yong-Hoon Kim, et al. "Flexible metal-oxide devices made by room-temperature photochemical activation of sol-gel films", Nature, vol. 489, No. 7414, 2012, 6 pages.
Myung-Gil Kim, et al. "Low-temperature fabrication of high-performance metal oxide thin-film electronics via combustion processing", Nature Materials, vol. 10, 2011, 7 pages.

\* cited by examiner

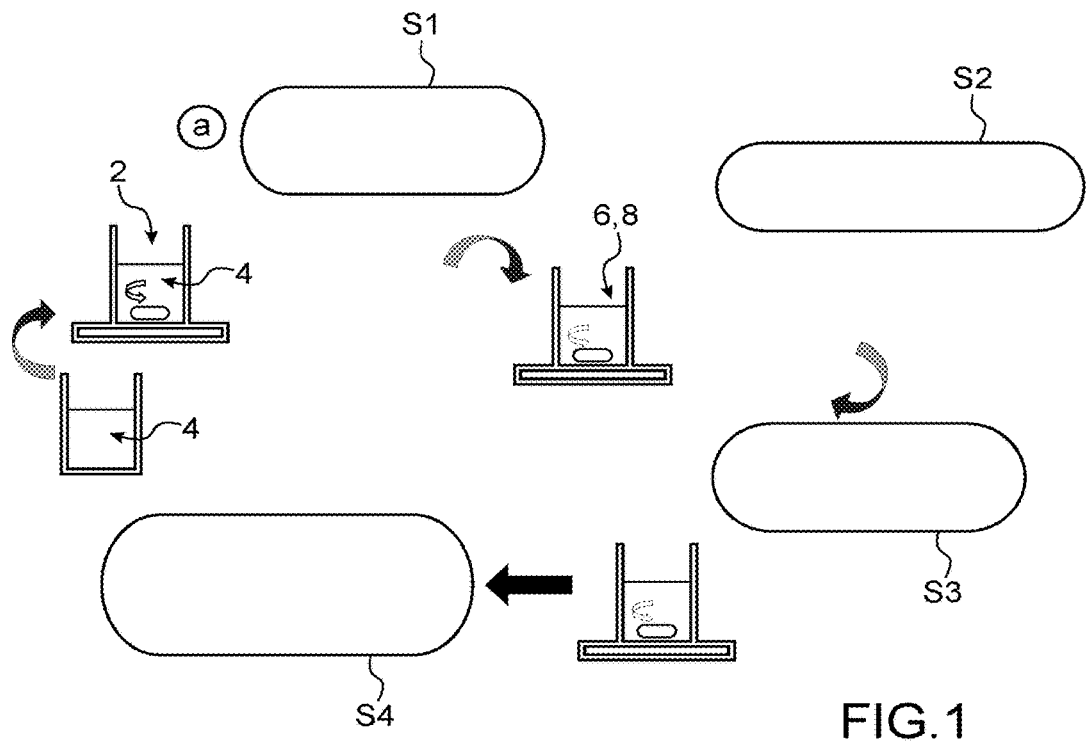
FIG.1
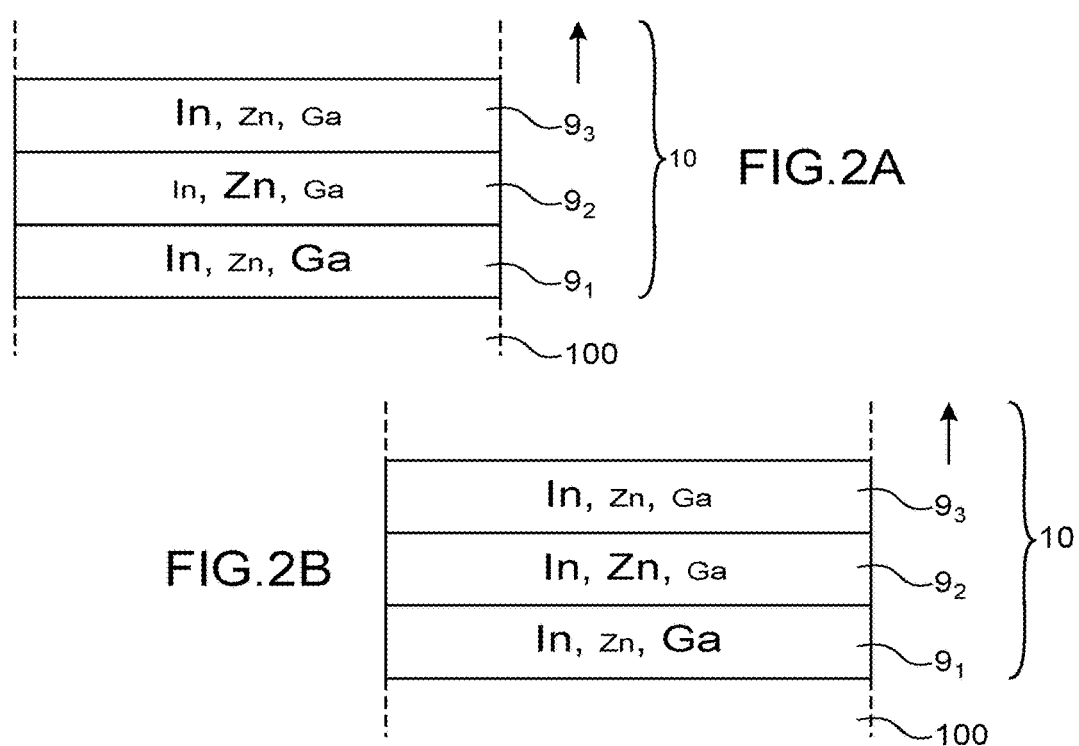
FIG.2A
FIG.2B

REDUCTION IN THE ANNEALING TEMPERATURE OF AN IGZO LAYER OBTAINED BY SOL GEL

TECHNICAL FIELD AND PRIOR ART

The present application relates to the field of TFTs (thin film transistors), in particular those provided with an active layer based on metal oxide such as IGZO (indium gallium zinc oxide).

As for a conventional transistor, in a TFT conduction takes place in a thin layer designated "active layer" between a source electrode and a drain electrode and in which the conductivity is modulated by a gate electrode.

TFTs currently exist in which the active layer is based on hydrogenated amorphous silicon (a-Si:H) or polycrystalline silicon (poly-Si). TFTs in which the active layer is made of a metal oxide such as IGZO have also appeared. Such a material has the advantage of having a charge carrier mobility greater than that of amorphous silicon or polysilicon.

A known technique for forming IGZO based layers is PVD (physical vapour deposition) and more specifically cathodic sputtering.

Such a method requires the establishment of a high vacuum, may cause composition non-uniformities, and may prove to be costly.

An alternative method for producing an active IGZO layer is the liquid process, notably using an ink jet method.

The ink is deposited on a support then dried. In order to obtain an oxide, a step of high temperature annealing, typically carried out at a temperature above 400° C., is next implemented. Such temperatures may prove to be incompatible with implementation on certain supports and in particular on polymer supports.

The document "Flexible metal-oxide devices made by room-temperature photochemical activation of sol-gel films," of Y.-H. Kim et al., Nature, vol. 489, no. 7414, p. 128-132, 2012 provides for producing an active IGZO layer by liquid process using a deposition solution that is transformed by photochemical effect by carrying out UV assisted annealing. Such a technique enables the metal oxide to be made active while limiting the annealing temperatures.

The document "Low-temperature fabrication of high performance metal oxide thin-film electronics via combustion processing," of M.-G. Kim et al., provides for the implementation of a metal oxide layer based on an oxidation-reduction reaction between nitrates and an organic fuel. This exothermic reaction leads to a faster reaction while consuming all the reagents at lower temperature. The technique described appears to make it possible to reduce the annealing temperature required for the activation of the metal oxide layer.

The problem is posed of finding a novel method for producing a layer based on metal oxide of IXZO type in which the annealing temperature required for its activation would be limited.

DESCRIPTION OF THE INVENTION

The inventors have discovered that the fact of producing a stack of metal oxide layers with atomic percentages of Zn, In and element X adapted and different from one layer to the next of the stack would make it possible to provide reduced annealing temperatures in order to make this stack active, and that an electronic component, in particular a transistor formed of such a material is functional, that is to say can follow different operating regimes (linear, saturated) and adopt different states (on, off) as a function of the manner in which it is biased.

The element X may be selected from the following elements: Ga, Sn, Sb, Be, Al, Ni.

According to one embodiment, the present invention relates to a method for forming on a substrate an active zone of metal oxide for an electronic device including:

a) liquid phase deposition on the substrate of a first solution based on indium, zinc and an element X selected from Ga, Sb, Be, Al, Ni, then heat treatment in such a way as to form a first layer made of a first metal oxide of $In_{a1}X_{b1}Zn_{c1}O_{d1}$, having a first atomic fraction of indium, a first atomic fraction of element X, a first atomic fraction of zinc, such that the first metal oxide is richer in indium and in element X than in zinc, b) liquid phase deposition on the first layer of a second solution based on indium, zinc and the element X, then heat treatment in such a way as to form a second layer made of a second metal oxide of $In_{a2}X_{b2}Zn_{c2}O_{d2}$, having a second atomic fraction of indium, a second atomic fraction of element X, a second atomic fraction of zinc, such that the second metal oxide is richer in zinc than in element X, and richer in zinc than the first oxide while being less rich in element X than the first oxide, c) liquid phase deposition on the second layer of a third solution based on indium, zinc and the element X, then heat treatment in such a way as to form a third layer made of a third metal oxide of $In_{a3}X_{b3}Zn_{c3}O_{d3}$, having a third atomic fraction of indium, a third atomic fraction of element X, a third atomic fraction of zinc, the third oxide being richer in element X than the second oxide while being less rich in zinc element than the second oxide.

Advantageously, the third oxide is richer in indium than in element X and than in Zn.

According to one particular embodiment, the second metal oxide is less rich in indium than the third oxide.

According to one advantageous embodiment, the element X may be gallium.

According to one particular embodiment, the first metal oxide may be IGZO with a first atomic fraction of indium comprised between 1 and 2, a first atomic fraction of gallium comprised between 0.5 and 1.5 (preferably above 1), a first atomic fraction of zinc comprised between 0.5 and 1, the second metal oxide being IGZO with a second atomic fraction of indium comprised between 0.5 and 1, a second atomic fraction of gallium comprised between 0.1 and 0.5, a second atomic fraction of zinc comprised between 1 and 2, the third metal oxide being IGZO with a third atomic fraction of indium comprised between 1 and 3 (preferably above 2), a third atomic fraction of gallium comprised between 0.4 and 0.6, a third atomic fraction of zinc comprised between 1 and 2.

With such a method, it is possible to provide reduced annealing temperatures which can make it possible to use the method with a polymer or plastic substrate.

The heat treatment(s) performed may be carried out at a temperature comprised between 150° C. and 400° C.

In order to improve the annealing of the first layer, the second layer and the third layer, the heat treatment may be accompanied by a pulsed photon treatment. Such a type of treatment makes it possible not to damage the substrate in so far as its heating its limited.

Advantageously, the heat treatment is accompanied by emission of a series of UV radiation pulses.

Advantageously, the substrate is made of polymer material.

Advantageously, the first layer is provided with a thickness comprised between 1 and 15 nm.

Similarly, the second layer may be provided with a thickness comprised between 1 and 15 nm.

The third layer may be provided with a thickness comprised between 1 and 15 nm.

The sequence of steps a), b), c) may be repeated a certain number k of times (with k an integer greater than 1) in order to form the stack.

Advantageously, the first solution, the second solution and the third solution are implemented using a sol-gel method.

A method according to the invention is quite particularly suited for the implementation of active zones of TFTs. Thus, the electronic device may include at least one TFT in which the channel zone is formed in said active zone.

BRIEF DESCRIPTION OF THE DRAWINGS

The present invention will be better understood on reading the description of exemplary embodiments given purely by way of illustration and in no way limiting, while referring to the appended drawings in which:

FIG. 1 serves to illustrate an example of method for producing a liquid deposition solution to form an IXZO metal oxide layer;

FIGS. 2A-2B serve to illustrate examples of stacks of metal oxide layers made of indium, zinc and another element X such as gallium and comprising different respective atomic fractions of indium, element X and zinc for the implementation of an active zone of an electronic component according to the invention;

Figure 3:
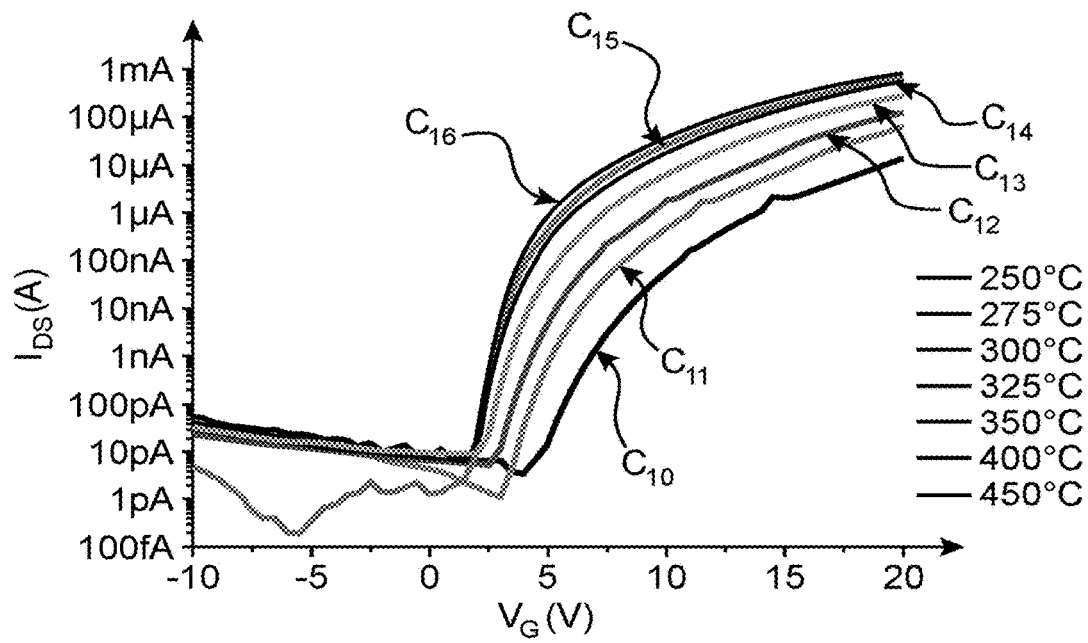
FIG. 3 gives different characteristic curves of channel current as a function of the gate voltage for TFTs comprising an active zone as implemented according to the invention, the respective active zones being obtained for different annealing temperatures.

Moreover, in the description hereafter, terms that depend on the orientation of the device apply by considering that the structure is oriented in the manner illustrated in the figures.

Identical, similar or equivalent parts of the different figures bear the same numerical references in order to make it easier to go from one figure to the next.

The different parts represented in the figures are not necessarily according to a uniform scale, in order to make the figures more legible.

DETAILED DESCRIPTION OF PARTICULAR EMBODIMENTS

An example of method for forming by liquid process a first layer $9_1$ of $In_{a1}X_{b1}Zn_{c1}O_{d1}$ metal oxide based on oxide of zinc, indium and another element X, on a substrate will now be given.

The element X is an element selected from the following elements: Ga, Sb, Be, Al, Ni, Y, Sn, Si, Sn, Mg, Ag, Ca, Cu. This element is preferably selected so as to have low affinity with oxygen such as Sb, Be, Ni, Al, Ga. The element X may be in particular antimony (X=Sb), or gallium (X=Ga). In the exemplary embodiment that will now be described gallium is selected as element X.

This first metal oxide layer is provided to form an active zone 10 comprising a stack of several layers $9_1$, $9_2$, $9_3$ of $In_aX_bZ_cO_d$ metal oxide having atomic percentages of Zn, In and element X which differ from one layer to the next of the stack (FIG. 2A).

For example, the first oxide layer $9_1$ is produced so as to have a first atomic fraction of indium with a first atomic percentage of In belonging to a first range, which may be for example comprised between 1 and 2. The first layer $9_1$ may also be provided with a first atomic fraction of gallium or an atomic percentage of gallium typically comprised between 0.5 and 1.5 (preferably above 1) and a first atomic fraction of Zn or atomic percentage of Zn typically comprised between 0.5 and 1.

The atomic fraction of indium and of gallium may be provided greater than and preferably much greater than that of zinc compared to the average composition that is to say the composition without optimisation (conventional). That is to say the initial concentration, it is that which is in this form $In_3Zn_2Ga_{0.4}$ of which the concentration of In=3 at %, Zn=2 at %, Ga=0.4 at %, consequently the In and Ga are above the value of In>2 At % and Ga>0.4 At % whereas the zinc is below 2 At %.

The first metal oxide layer $9_1$ may be formed by means of a sol-gel type method implementing a polymerisation process analogous to that of organic polymerisation and using precursors in solution.

Preferably a liquid solution comprising metal salts is employed rather than another synthesis process with alkoxide type organometallic compounds. This other process would in fact require the implementation of an inert atmosphere and the use of high temperatures.

The solution typically comprises a chelator such as for example citric acid and a solvent, such as 2-methoxyethanol (hereafter designated "2ME"), suited both to dissolving the precursors and fulfilling the function of cross-linking agent.

Metal salts including the cationic species $In^{3+}$, $Zn^{2+}$, $X^{n+}$ with $X^{n+}$ for example $Ga^{3+}$ and at least one anionic species of chloride, nitrate, acetate type are in particular employed as precursors.

According to a particular embodiment, acetates are used. They have good stability notably because they are insensitive to the presence of water and, after decomposition, have the advantage of forming electrically stable oxides. Acetates also make it possible to lead to better reproducibility of the method.

The gallium species may be introduced in the form of acetylacetonate. The indium may for its part be introduced in the form of indium acetate. An acetic acid solution may make it possible to facilitate the dissolution of the indium acetate in the 2ME solvent.

According to an example of synthesis of the first solution, said solution is formed from 3 solutions A, B, C:
- the solution A containing for example 0.2M of indium in a 2ME solvent with indium acetate;
- the solution B containing for example 0.4M of zinc in 2ME with zinc acetate dihydrate;
- the solution C containing 0.02M gallium(III) acetylacetonate.

In an alternative, another element X than gallium may be used to form the IGXO oxide. In this case, the solution C may be formed for example from one of the compounds selected from the following list: silver(II) acetate, palladium (II) acetate, copper(II) acetate, magnesium acetate tetrahydrate, nickel(II) acetate tetrahydrate, calcium acetate hydrate, manganese(II) acetate, tin(II) acetate, antimony(III) acetate, molybdenum(II) acetate, aluminium acetate, yttrium (III) acetate hydrate, beryllium acetate.

The proportion between the complexing agent and the solution may be provided for example at 1 to 8, whereas the ratio between acetic acid and the solution may for example be provided at 1 to 8.

An example of generic method for synthesising the first solution is illustrated in a schematic manner in FIG. 1.

The metal precursors, in particular in the form of metal acetates 2, are firstly dissolved (step S1) in a solvent 4 such as for example 2ME under stirring at a temperature for example of the order of 50° C. The stirring under heating may have a duration adapted preferably until a solution of clear and limpid aspect is obtained. For example, a stirring duration of the order of 30 minutes is provided.

Next, to form the metal complexes (step S2) and stabilise the solution in order to avoid precipitation, a first agent 6 such as acetic acid is introduced in a molar ratio for example of 1 to 8.

Then, a complexing agent 8 such as ethanolamine is added, in a molar ratio that may also be 1 to 8.

The solution is next stirred at a temperature above room temperature for example of the order of 70° C. for a duration which may be several hours until a clear and homogeneous solution is obtained.

Concomitantly, a chelation reaction occurs around the metal ions to form metal complexes. The rate of hydrolysis may be increased by implementing an acid catalysis. The use of acetic acid makes it possible in particular to reduce the duration of a gelling process. An exothermic reaction then takes place when acetic acid is added. A solution of limpid aspect may then be obtained.

It is then possible to add a base such as ethanolamine to make it possible to shift the reaction towards a basic medium (step S3). The (C=N) bond of ethanolamine makes it possible to produce a very stable complex ligand with the metal ions.

Simultaneously with the complexation, the polymerisation begins to form macromolecules which bind together in order to obtain a polymeric precursor. The polymerisation reaction is generally a slow reaction which may require a duration above 12 h to be completely finished.

A reaction at a temperature above room temperature (for example of the order of 70° C.) is carried out under stirring. The gelling duration may vary between several minutes and several days. Such a duration may be attributed to the complexing capacity of the acetate ligand.

It is then possible to leave the first solution to rest for a duration of the order of 12 h for example, before it is ready to be deposited on a substrate.

Next, the solution is sampled by means of a sampling device, for example such as a micropipette, in order to be deposited on a substrate cleaned beforehand. This deposition is carried out by spin coating, followed by annealing of the layer. The annealing may be carried out a temperature of 450° C. under air.

The deposition (step S4) of the first solution may next be carried out on a substrate 100 by spin coating, the substrate being itself arranged on a turning support.

Typically, this deposition may be carried out in two phases: a first designated "low" speed of the turning support in order to spread out the solution. Then, a second at a higher rate is carried out in order to obtain a homogenous layer.

The parameters of duration and speed of rotation of the turning support are selected as a function of the type of substrate 100 on which the deposition is carried out in order to obtain a layer with the most uniform possible thickness while limiting the number of defects.

For example, when the substrate 100 is made of glass, a first phase of the deposition is carried out at a preferably low speed, for example 500 rpm for a duration for example of the order of 5 s, then a second phase of the deposition at higher speed which may be for example of the order of 1500 rpm for a longer duration, for example of the order of 30 s.

The first layer $9_1$ of $In_{a1}X_{b1}Zn_{c1}O_{d1}$ has a thickness that may be several nanometers, for example between 1 and 15 nanometers, typically less than or equal to 5 nm and for example of the order of 2 nm.

The deposition is followed by at least one annealing or heat treatment making it possible to dry and to remove volatile elements and to decompose the precursors or organic residues.

The physical characteristics of the layer of $In_{a1}X_{b1}Zn_{c1}O_{d1}$ thereby produced depend on the conditions of raising the temperature and the gaseous environment during this heat treatment. The decomposition of the organic precursors takes place according to the temperature but also as a function of the starting liquid thickness, the greater the liquid thickness the greater the rise in temperature and the longer the duration.

Such a heat treatment may be carried out at a temperature comprised between 150° C. and 450° C. for example of the order of 300° C. The heat treatment is advantageously accompanied or carried out using a pulsed photon treatment, during which UV radiation pulses are emitted, said pulses having a duration which may be comprised for example between 0.001 ms and 2 ms with an energy which may be of the order of 2000 Joules.

Next, after producing the first layer $9_1$, on the first metal oxide layer $9_1$ is formed a second layer $9_2$ of metal oxide $In_{a2}X_{b2}Zn_{c2}O_{d2}$ with atomic percentages of Zn, In and gallium which differ from those of the first layer $9_1$. The second layer $9_2$ may be produced in such a way as described previously, the quantities of precursors in the solutions A, B, C being adapted in order to obtain the desired atomic fractions.

The second layer $9_2$ is provided with an atomic fraction of indium, an atomic fraction of gallium, an atomic fraction of zinc, so as to be richer in zinc than in gallium. The second layer $9_2$ is also richer in zinc than the first layer $9_1$. The second layer $9_2$ may also be less rich in gallium than the first layer $9_1$.

For example the second oxide layer $9_2$ is produced so as to have a second atomic fraction of indium with a second atomic percentage of In belonging to a range, which may be for example comprised between 0.5 and 1 (preferentially equal to 1). The second layer $9_2$ may also be provided with a second atomic fraction of gallium or an atomic percentage of gallium typically comprised between 0.1 and 0.5 (preferentially 0.4) and a second atomic fraction of Zn or atomic percentage of Zn typically comprised between 1 and 2 (preferentially equal to 2) The second layer $9_2$ of $In_{a2}X_{b2}Zn_{c2}O_{d2}$ has a thickness that may be provided of the order of several nanometers, for example between 1 and 15 nanometers, typically less than or equal to 5 nm and for example of the order of 2 nm.

The deposition of the second layer $9_2$ is also followed by at least one annealing or heat treatment. The annealing or heat treatment may be carried out at a temperature comprised between 150° C. and 450° C., for example of the order of 300° C.

Next, on the second metal oxide layer $9_2$ is formed a third layer $9_3$, of metal oxide $In_{a3}X_{b3}Zn_{c3}O_{d3}$ having atomic percentages of Zn, In and gallium which differ from those of the first layer $9_1$ and the second layer $9_2$. The third layer $9_3$ may also be produced in the manner as described previously for the first layer or the second layer, by adapting the molar concentrations of the deposition solution.

The third layer $9_3$ is provided with a third atomic fraction of indium, a third atomic fraction of gallium, a third atomic fraction of zinc. The third layer $9_3$ may for example be richer in indium than in gallium and than in zinc. The third layer $9_3$ may also be richer in gallium than the second layer $9_2$. The third layer $9_3$ is also preferably provided less rich in element zinc than the second layer $9_2$.

For example, the third oxide layer $9_3$ is produced so as to have a third atomic fraction of indium with a first atomic percentage of In belonging to a range, which may be for example comprised between 1 and 3 (preferentially above 2). The third layer $9_3$ may also be provided with a third atomic fraction of gallium or an atomic percentage of gallium typically comprised between 0.4 and 0.6 (preferentially 0.4) and a third atomic fraction of Zn or atomic percentage of Zn typically comprised between 1 and 2 (preferentially 1.5).

The third layer $9_3$ of $In_{a3}X_{b3}Z_{c3}O_{d3}$ has a thickness that may be provided of the order of several nanometers, for example between 1 and 15 nanometers, preferably less than or equal 5 nm, for example of the order of 2 nm.

The deposition of the third layer $9_3$ is also followed by at least one annealing or heat treatment. The annealing or heat treatment may be carried out a temperature comprised between 150° C. and 450° C., for example of the order of 300° C.

It is possible to provide to repeat the stack of three layers described previously, for example k times (k being an integer greater than 1), and to do so in order to produce on a substrate 100 an active zone 10 of final thickness that may be comprised for example between 10 and 100 nm.

To do so, the sequence of steps described previously may be repeated k times.

An example of stack of at least 3 layers $9_1$, $9_2$, $9_3$ of the type of those as described previously is given in FIG. 2A, in which the size of the chemical symbols of the different components is representative of an atomic fraction, the larger the size of a symbol representative of a chemical element the higher its atomic fraction in the oxide. Conversely, the smaller the size of a symbol representative of a chemical element, the lower its atomic fraction in the oxide.

In this way is formed the first layer $9_1$ from a solution such that [In]≥[Ga]>>[Zn] (the notation [.] corresponding to a concentration of a given element, and "≥" and ">>" signifying, respectively, greater than or equal to and much greater than). The second layer $9_2$ has been formed from a solution such that [Zn]≥[In]>>[Ga]. The third layer $9_3$ has been formed from a solution such that [In]≥[Ga] and [In]≥[Zn].

In this example, the atomic fraction of indium in the second layer $9_2$ may be less than that of the first layer $9_1$ and third layer $9_3$. The atomic fraction of zinc in the second layer $9_2$ may be greater than the atomic fractions of Zn in the first layer $9_1$ and the third layer $9_3$. The atomic fraction of gallium in the second layer $9_1$ may be greater than the atomic fractions of gallium in the second layer $9_2$ and the third layer $9_3$.

An alternative embodiment of the stack of layers $9_1$, $9_2$, $9_3$ is illustrated in FIG. 2B. For this alternative, the implementation is provided of an active zone comprising a first oxide layer $9_1$, a second oxide layer $9_2$ and a third oxide layer $9_3$ produced so as to have "high" respective atomic fractions of indium. "High in indium" is taken to mean for example between 2 and 3.

For this alternative, the first layer $9_1$, the second oxide layer $9_2$ and the third oxide layer $9_3$ may be provided with respective atomic fractions of "high" in Ga, "low" in Ga and "moderate" in Ga. "High in Ga" is taken to mean for example between 0.6 and 0.8. "Low in Ga" is taken to mean for example between 0.1 and 0.4. "Moderate in Ga" is taken to mean for example respectively between 0.4 and 0.6.

The first layer $9_1$, the oxide layer $9_2$ and the third oxide layer $9_3$ may be provided with respective atomic Zn fractions, "low" in Zn, "high" in Zn and "moderate" in Zn. "Low in Zn" is taken to mean for example between 0.5 and 1. "High in Zn" is taken to mean for example between 2 and 3, and "moderate in Zn" is taken to mean for example between 1 and 2.

A particular exemplary embodiment of active zone of TFT according to the invention is formed of a stack of at least three layers of IGZO metal oxide with atomic fractions of In, Ga, Zn, different to each other, and an atomic fraction of indium different from one layer to the next of the stack and in particular increasing when the stack is considered in moving away from the substrate 100.

In this particular exemplary embodiment, and relative to FIG. 2A, the first metal oxide layer has atomic percentages of In, Ga, Zn respectively of 3, 0.8, 1, whereas the second metal oxide layer, resting on the first layer, has atomic percentages of In, Ga, Zn respectively of 1, 0.4, 2. The third metal oxide layer, resting on the second layer, is for its part provided with atomic percentages of In, Ga, Zn respectively of 3, 0.4, 1.

In another particular exemplary embodiment, the first metal oxide layer has atomic percentages of In, Ga, Zn respectively of 1.5, 0.8, 0.5, whereas the second metal oxide layer, resting on the first layer, has atomic percentages of In, Ga, Zn respectively of 3, 0.4, 2. The third metal oxide layer, resting on the second layer, is for its part provided with atomic percentages of In, Ga, Zn respectively of 3, 0.4, 1.

FIG. 3 gives different characteristic curves $C_{10}$, $C_{11}$, $C_{12}$, $C_{13}$, $C_{14}$, $C_{15}$, $C_{16}$ Ids=f(Vg), of channel current as a function of the gate voltage of a TFT in which the active zone has a composition identical to that of the particular example relative to FIG. 2A. These characteristic curves are representative of performances of active zones obtained for different annealing temperatures, respectively of 250° C., 275° C., 300° C., 325° C., 350° C., 400° C., 450° C.

It may be observed that for an annealing temperature of 250° C. or 300° C. a functional transistor is obtained. The implementation of the stack of oxide layers of different compositions makes it possible to limit the annealing temperature required to obtain a functional active zone in which the conductivity may be modulated by the gate to make it possible to confer to the different transistors an operating regime and a state among several possible operating regimes and states.

Figure 4:
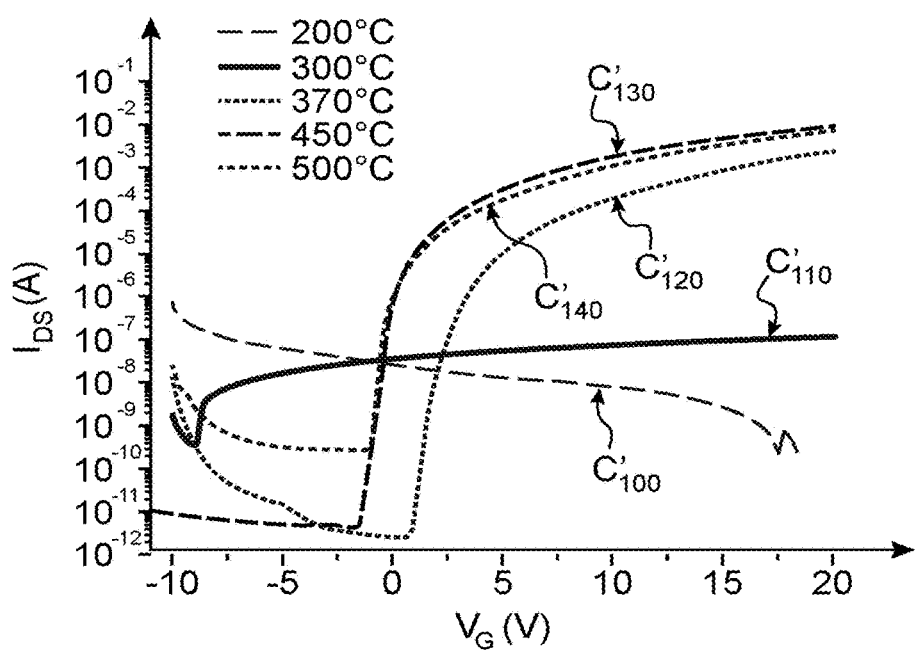
FIG. 4 gives different characteristic curves of channel current as a function of the gate voltage for TFTs comprising an active zone as implemented according to the prior art, the respective active zones being obtained for different annealing temperatures.

As a comparison, FIG. 4 gives different characteristic curves $C'_{100}$, $C'_{110}$, $C'_{120}$, $C'_{130}$, $C'_{140}$, Ids=f(Vg), of channel current as a function of the gate voltage of a transistor according to the prior art. This transistor comprises a single layer of IGZO of 5 nm thickness with atomic concentrations of indium, gallium, and zinc respectively of 3, 0.4, 2, and does so for different annealing temperatures to form the active zone, respectively of 200° C., 300° C., 370° C., 450° C., 500° C. It may be observed that thermal annealings at 200° C. and 300° C. are not sufficient to make it possible to make the IGZO zone active and the TFT functional.

Figure 5:
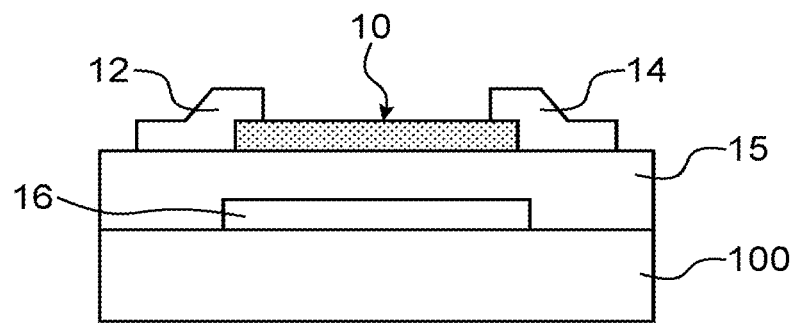
FIG. 5 serves to illustrate an example of structure of TFT transistor formed of an active zone as implemented according to the invention.

An example of structure of transistor integrating an active zone 10 formed in such a way as described previously based on a stack of layers of metal oxides of different compositions is illustrated in FIG. 5.

In this example, the transistor is provided with a gate 16 in a configuration of the type designated "upper gate" or "top gate". The gate electrode 16 is thereby arranged on the active layer 10 and makes it possible to command a channel zone produced in this layer 10 and which is arranged between the source 12 and drain 14 electrodes, and situated facing the gate electrode 16.

The transistor is formed on a substrate 100 which may be semi-conductor and for example made of silicon or based on a transparent material such as glass.

Advantageously, the substrate 100 is made of an elastic material, in particular a polymer material for example such as polyimide (PI) or polyetheretherketone (PEEK) or polyarylate (PAR) or PEI (polyetherimide).

In this exemplary embodiment, the active zone 10 is surmounted by a gate dielectric layer 15, for example a layer based on polystyrene of 200 nm thickness whereas a gate electrode 16, for example based on silver of 50 nm thickness rests on the dielectric layer 15, and is thus situated above the source 12 and drain 14 electrodes.

Figure 6:
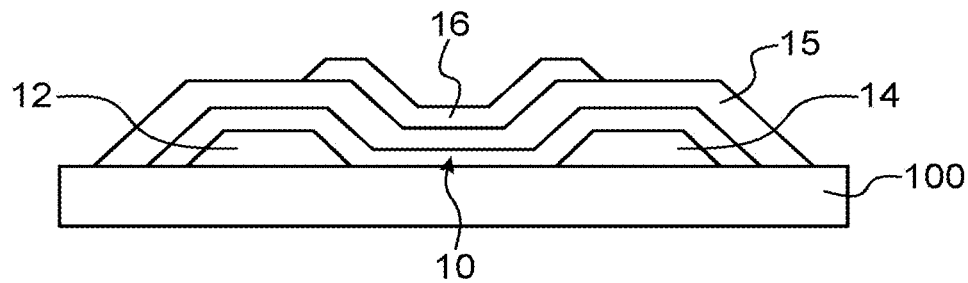
FIG. 6 serves to illustrate another example of structure of TNT transistor formed of an active zone as implemented according to the invention.

Another example of structure of transistor integrating an active layer 10 as described previously is illustrated in FIG. 6 with this time a configuration of the type called "bottom gate". The gate 16 is thereby arranged under the active layer 10 and under the source 12 and drain 14 electrodes.

According to another alternative embodiment (not represented) the active layer 10 is integrated in a coplanar structure which, unlike the stacked structures described previously, provides a layout of the three electrodes 12, 14, 16 on a same side of the active layer 10.

To make it possible to characterise an active zone based on metal oxide, for example a zone formed of a stack of oxides of different atomic fractions and such as implemented by means of a method as described previously, a GISAXS (grazing-incidence small-angle X-ray scattering) method may be employed. This method makes it possible to obtain morphological information or instead to characterise the internal structure of the active zone.

This method highlights, in particular, an order in a distribution of pores in the active zone, which changes as a function of the annealing temperature.

Such a method shows that the distance between the pores increases by several nanometers when the annealing temperature is raised for example from 300° C. to 450° C.

In addition to highlighting a spatial correlation in the arrangement of the pores in an annealed IGZO zone, the GISAXS analysis method, in particular in anomalous mode (AGISAXS), can make it possible to apprehend the local arrangement of the atoms of the IGZO based material.

In order to make it possible to describe the arrangement and the links that maintain the three elementary oxides of indium, zinc and gallium in the material of the active zone, measurements at small angles with several X-ray energies in anomalous grazing incidence of the element to analyse may be carried out.

Analysis of images obtained by the AGISAXS method shows the appearance of Zn rich regions and those of Ga rich regions in the IGZO layers annealed at different temperatures and make it possible to show that there is an auto-organisation of inorganic nano-clusters in the thin IGZO layers which are a function of the annealing temperature. The AGISAXS technique probes the structure of an IGZO layer not just in the parallel direction but also in the direction perpendicular to the substrate. Pores are created spontaneously when the IGZO solution is annealed at a certain temperature as indicated previously. The ordered nanoparticles coming from the separation of phases of the different oxides are highlighted thanks to the appearance of interference peaks signifying a preferential distance between the nanoparticles probed.

Figure 7A:
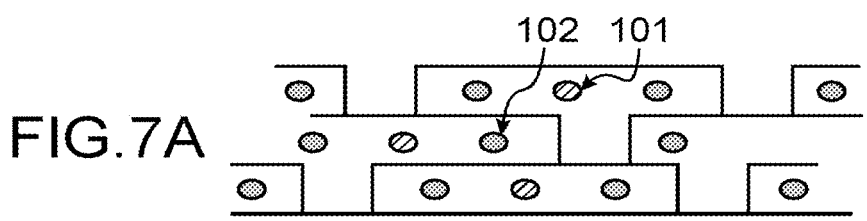
FIGS. 7A-7C illustrate different configurations of particles of gallium and zinc in an IGZO material as a function of the annealing temperature.
Figure 7B:
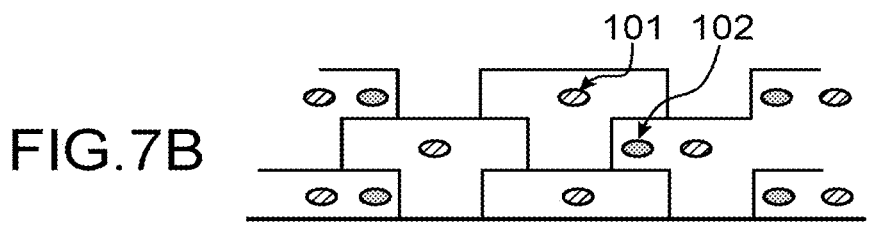
Figure 7C:
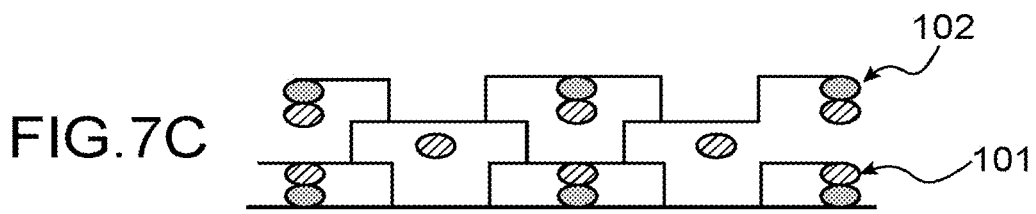

FIGS. 7A-7C illustrate in a schematic manner the layout, such as revealed by the AGISAXS analysis method, of nanoparticles 101 of Zn and nanoparticles 102 of Ga in a IGZO metal oxide, for different annealing temperatures. For an annealing temperature above 300° C. (FIGS. 7A-7B), certain residual organic products of the deposition solution evaporate, which thereby gives a porous network. Meanwhile, the metal oxides become organised with the emergence of clusters in the form of nanoparticles at a distance in the plane from the oxide layer having a periodicity linked to that of the porous network. When the annealing temperature reaches 450° C. (FIG. 7C), the distance between Zn rich zones is equal to that of Ga rich zones, in the same way equal to the average distance between the pores.

Another method of analysing the material of the active zone may use medium-energy ion scattering (MEIS) equipment.

The MEIS equipment used may employ helium as incident particle at an energy of 100 keV.

Generally speaking, measurement by MEIS spectroscopy can make it possible to establish or to check the stoichiometry of the metal oxide as a function of energy loss, that is to say as a function of the quantity of material passed through and thus of the product "total density of material" by "thickness". In order to arrive at the thicknesses of the layers, it is possible to make a hypothesis regarding the total density.

For IGZO with fractions of In of 30%, Ga of 5%, Zn of 18%, and oxygen of 48%, it is possible to take for example as density hypothesis a constant density equal to that of amorphous bulk IGZO of 6.1 g/cm$^{-3}$.

The structural data of the analyses may be used to obtain fundamental quantities, such as the size of the domains of the elementary oxides which constitute the IGZO metal oxide, the size of the pores, as well as the position of the oxides in three dimensions.

The invention claimed is:

1. A method for forming on a substrate an active zone of metal oxide for an electronic device including:
   a) liquid phase deposition on the substrate of a first solution based on indium, zinc and an element X selected from Ga, Sb, Be, Al, Ni, then heat treatment in such a way as to form a first layer made of a first metal oxide of $In_{a1}X_{b1}Zn_{c1}O_{d1}$, having a first atomic fraction of indium, a first atomic fraction of element X, a first atomic fraction of zinc, such that the first metal oxide is richer in indium and in element X than in zinc,
   b) liquid phase deposition on the first layer of a second solution based on indium, zinc and the element X, then heat treatment in such a way as to form a second layer made of a second metal oxide of $In_{a2}X_{b2}Zn_{c2}O_{d2}$, having a second atomic fraction of indium, a second atomic fraction of element X, a second atomic fraction of zinc, such that the second metal oxide is richer in zinc than in element X, and richer in zinc than the first oxide while being less rich in element X than the first oxide, c) liquid phase deposition on the second layer of a third solution based on indium, zinc and the element X, then heat treatment in such a way as to form a third layer made of a third metal oxide of $In_{a3}X_{b3}Zn_{c3}O_{d3}$, having a third atomic fraction of indium, a third atomic fraction of element X, a third atomic fraction of zinc, the third oxide being richer in element X than the second oxide while being less rich in element Zn than the second oxide.

2. The method according to claim 1, wherein the third oxide is richer in indium than in element X and than in Zn.

3. The method according to claim 2, wherein the second metal oxide is less rich in indium than the third oxide.

4. The method according to claim 1, wherein the element X is gallium, the first metal oxide being IGZO with a first atomic fraction of indium comprised between 1 and 2, a first atomic fraction of gallium comprised between 0.5 and 1.5, a first atomic fraction of zinc comprised between 0.5 and 1, the second metal oxide being IGZO with a second atomic fraction of indium comprised between 0.5 and 1, a second atomic fraction of gallium comprised between 0.1 and 0.5, a second atomic fraction of zinc comprised between 1 and 2, the third metal oxide being IGZO with a third atomic fraction of indium comprised between 1 and 3, a third atomic fraction of gallium comprised between 0.4 and 0.6, a third atomic fraction of zinc comprised between 1 and 2.

5. The method according to claim 1, wherein the heat treatment is carried out a temperature comprised between 150 and 450° C.

6. The method according to claim 5, wherein the heat treatment is accompanied by emission of a series of UV radiation pulses.

7. The method according to claim 1, wherein the substrate is made of polymer material.

8. The method according to claim 1, wherein the first layer, the second layer and the third layer have a thickness comprised between 1 and 15 nm.

9. The method according to claim 1, wherein the sequence of steps a), b), c) is repeated k times, with k an integer greater than 1.

10. The method according claim 1, wherein the first solution, the second solution and the third solution are implemented using a sol-gel method.

11. The method according to claim 1, wherein the electronic device includes at least one TFT in which the channel zone is formed in said active zone.

* * * * *

UNITED STATES PATENT AND TRADEMARK OFFICE
CERTIFICATE OF CORRECTION

PATENT NO. : 10,381,220 B2  
APPLICATION NO. : 15/905359  
DATED : August 13, 2019  
INVENTOR(S) : Mohammed Benwadih et al.

Page 1 of 1

It is certified that error appears in the above-identified patent and that said Letters Patent is hereby corrected as shown below:

On the Title Page

Item (30), the Foreign Application Priority Data is incorrect. Item (30) should read:
--(30)  Foreign Application Priority Data
Mar. 1, 2017     (FR)................ 17 51675--

Signed and Sealed this
Fifteenth Day of October, 2019

Andrei Iancu
*Director of the United States Patent and Trademark Office*